United States Patent
Suemasa

(10) Patent No.: US 9,418,866 B2
(45) Date of Patent: Aug. 16, 2016

(54) GAS TREATMENT METHOD

(71) Applicant: TOKYO ELECTRON LIMITED, Tokyo (JP)

(72) Inventor: Tomoki Suemasa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/405,416

(22) PCT Filed: May 21, 2013

(86) PCT No.: PCT/JP2013/064011
§ 371 (c)(1),
(2) Date: Dec. 4, 2014

(87) PCT Pub. No.: WO2013/183437
PCT Pub. Date: Dec. 12, 2013

(65) Prior Publication Data
US 2015/0170931 A1    Jun. 18, 2015

(30) Foreign Application Priority Data
Jun. 8, 2012    (JP) .................................. 2012-130815

(51) Int. Cl.
*H01L 21/311* (2006.01)
*H01L 21/67* (2006.01)

(52) U.S. Cl.
CPC .... *H01L 21/31111* (2013.01); *H01L 21/31116* (2013.01); *H01L 21/67069* (2013.01)

(58) Field of Classification Search
None
See application file for complete search history.

(56) References Cited

U.S. PATENT DOCUMENTS

| | | | | |
|---|---|---|---|---|
| 8,801,952 B1 * | 8/2014 | Wang | ........................ | B44C 1/22 216/73 |
| 9,153,442 B2 * | 10/2015 | Wang | .................. | H01L 21/6708 |
| 2003/0000924 A1 * | 1/2003 | Strang | ............... | C23C 16/45523 216/86 |
| 2006/0006136 A1 * | 1/2006 | Mosden | .............. | H01L 21/0276 216/37 |
| 2011/0065276 A1 * | 3/2011 | Ganguly | ............. | H01L 21/0223 438/694 |
| 2011/0294300 A1 * | 12/2011 | Zhang | ............... | H01L 21/32137 438/719 |
| 2013/0200518 A1 * | 8/2013 | Ahmed | ............. | H01L 21/76843 257/750 |
| 2014/0273489 A1 * | 9/2014 | Wang | .................. | H01L 21/6708 438/716 |

FOREIGN PATENT DOCUMENTS

| | | |
|---|---|---|
| JP | 2005039185 A | 2/2005 |
| JP | 2008160000 A | 7/2008 |

OTHER PUBLICATIONS

International Search Report dated Jul. 31, 2013 corresponding to application No. PCT/JP2013/064011.

* cited by examiner

*Primary Examiner* — Allan Olsen
(74) *Attorney, Agent, or Firm* — Nath, Goldberg & Meyer; Jerald L. Meyer

(57) ABSTRACT

A gas processing method is described. A workpiece is mounted on a platform in a chamber on which a silicon oxide film is formed on a surface of the workpiece; HF gas and a $NH_3$ gas, as reaction gases, are discharged onto the workpiece on the platform from a plurality of gas discharge holes of a shower plate; and a treatment for causing a reaction between the reaction gases and the silicon oxide film on the surface of the workpiece is performed. Subsequently, the reaction product resulting from the treatment is heated and removed by decomposition, whereby etching is performed. The shower plate is divided into a plurality of regions in correspondence with the workpiece, and the gas discharge holes in one or more of the regions are blocked to control a distribution of at least one of the HF gas and the $NH_3$ gas.

5 Claims, 7 Drawing Sheets

GAS TREATMENT METHOD

TECHNICAL FIELD

The present disclosure relates to a gas processing method of performing a chemical oxide removal process using a mixture gas of hydrogen fluoride (HF) gas and ammonia ($NH_3$) gas.

BACKGROUND

In recent years, in the process of manufacturing semiconductor devices, a process called chemical oxide removal (COR) has been highlighted as an alternative method to dry etching or wet etching for realizing a fine etching process.

A process of etching a silicon oxide film using the COR technique has been known (for example, see Patent Documents 1 and 2). Specifically, in a chamber maintained in a vacuum state, a hydrogen fluoride (HF) gas and an ammonia ($NH_3$) gas are adsorbed onto a silicon oxide film ($SiO_2$ film) on a surface of a semiconductor wafer during the COR process. The gases react with the silicon oxide film to generate ammonium fluorosilicate (($NH_4)_2SiF_6$; AFS). The ammonium fluorosilicate is heated and thereby evaporated in the subsequent step so that the silicon oxide film is etched.

PRIOR ART DOCUMENTS

Patent Documents

Patent Document 1: Japanese laid-open publication No. 2005-39185

Patent Document 2: Japanese laid-open publication No. 2008-160000

In Patent Document 2, the HF gas and the $NH_3$ gas are introduced into the chamber through a shower head installed above the semiconductor wafer. However, in some cases, etching uniformity may be deteriorated due to the non-uniformity of distribution of these gases. In addition, there are also instances where an etching distribution needs to be actively controlled. However, when the gases are introduced through the shower head, it is difficult to control the etching distribution.

Therefore, the present disclosure provides some embodiments of a gas processing method capable of controlling an etching distribution when a silicon oxide film is etched by HF and $NH_3$ gases.

SUMMARY

That is, according to one embodiment of the present disclosure, there is provided a gas processing method in which an object to be processed having a silicon oxide film formed on a surface thereof is mounted on a mounting table in a chamber, an HF gas and an $NH_3$ gas are discharged as reaction gases onto the object to be processed mounted on the mounting table through a plurality of gas discharge holes of a shower plate installed above the mounting table corresponding to the object to be processed mounted on the mounting table. A process of causing a reaction of the HF gas and the $NH_3$ gas with the silicon oxide film on the object to be processed is performed, and thereafter a reaction product generated by the reaction is heated and removed by decomposition, thereby performing an etching process, wherein the shower plate is divided into a plurality of regions according to the object to be processed, and the gas discharge holes of any one or more of the plurality of regions are blocked to control a distribution of the HF gas and/or the $NH_3$ gas.

In the present disclosure, the shower plate may be concentrically divided into an inside region and an outside region, and the gas discharge holes of any one of these regions may be blocked to control a distribution of the HF gas and/or the $NH_3$ gas.

In addition, the shower head may be configured such that the HF gas is discharged through a plurality of first gas discharge holes provided at the shower plate and the $NH_3$ gas is discharged through a plurality of second gas discharge holes provided at the shower plate. In this case, any one or both of the first gas discharge holes and the second gas discharge holes of the shower plate may be blocked.

In some embodiments, the reaction is conducted at an internal pressure of the chamber at 50 to 2000 mTorr. In addition, in some embodiments, a distance from a bottom surface of the shower plate to the surface of the object to be processed on the mounting table is in a range of 50 to 150 mm.

DETAILED DESCRIPTION

Hereinafter, various embodiments of the present disclosure will be described with reference to the drawings.

Figure 1:
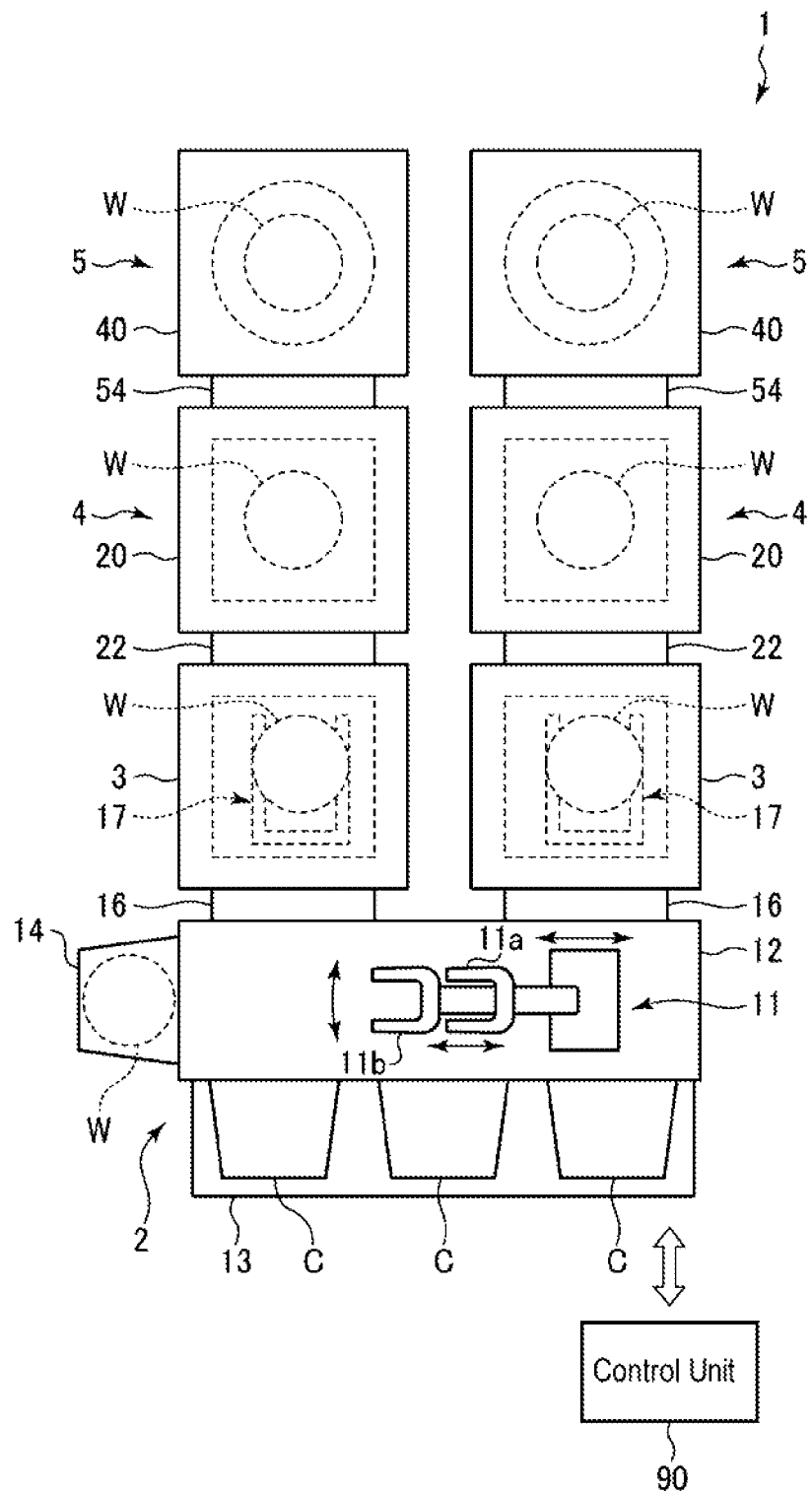
FIG. 1 is a plan view showing a schematic configuration of a processing system according to one embodiment of the present disclosure.

FIG. 1 is a view showing a schematic configuration of a processing system for performing a gas processing method according to one embodiment of the present disclosure. A processing system 1 includes a loading/unloading unit 2 for loading and unloading semiconductor wafers W (which can also be simply referred to as wafers), two load lock chambers (L/Ls) 3 installed adjacent to the loading/unloading unit 2, PHT (Post Heat Treatment) processing apparatuses (PHTs) 4 respectively installed adjacent to the load lock chambers 3 and configured to perform a PHT process on wafers W, and COR processing apparatuses (CORs) 5 respectively installed adjacent to the PHT processing apparatuses 4 and configured to perform a COR process on respective wafers W. The load lock chamber 3, the PHT processing apparatus 4 and the COR processing apparatus 5 are arranged along a straight line in the aforementioned order.

The loading/unloading unit 2 includes a transfer chamber (L/M) 12 having a first wafer transfer mechanism 11 installed therein to transfer wafers W. The first wafer transfer mechanism 11 includes two transfer arms 11a and 11b each configured to support a wafer W in a generally horizontal position. A mounting table 13 is installed at a lateral side in the longitudinal direction of the transfer chamber 12. The mounting table 13 is configured such that, for example, three carriers C, each of which can accommodate a plurality of arranged wafers W, may be connected to the mounting table 13. In addition, an orienter 14 is installed adjacent to the transfer chamber 12 and configured to optically detect misalignment of a wafer W by rotating the wafer W and to perform alignment thereof.

In the loading/unloading unit 2, wafers W are supported by the transfer arms 11a and 11b. The wafers W are transferred to desired positions by the first wafer transfer mechanism 11, while being moved linearly in the horizontal plane or moved up and down in the vertical direction. Further, the wafers W are loaded and unloaded among the carriers C on the mounting table 13, the orienter 14, and the load lock chambers 3 by the transfer arms 11a and 11b being moved back and forth.

Each of the load lock chambers 3 is respectively connected to the transfer chamber 12 with a gate valve 16 interposed therebetween. Each load lock chamber 3 has a second wafer transfer mechanism 17 installed therein to transfer wafers W. The load lock chamber 3 is configured to be vacuum exhausted to a predetermined vacuum level.

The second wafer transfer mechanism 17 has an articulated arm structure and a pick configured to support a wafer W in a generally horizontal position. In the second wafer transfer mechanism 17, the pick may be positioned inside the load lock chamber 3 when the articulated arm is contracted, the pick may contact the PHT processing apparatus 4 when the articulated arm is extended, and the pick may contact the COR processing apparatus 5 when the articulated arm is further extended. Accordingly, a wafer W may be transferred among the load lock chamber 3, the PHT processing apparatus 4, and the COR processing apparatus 5.

Figure 2:
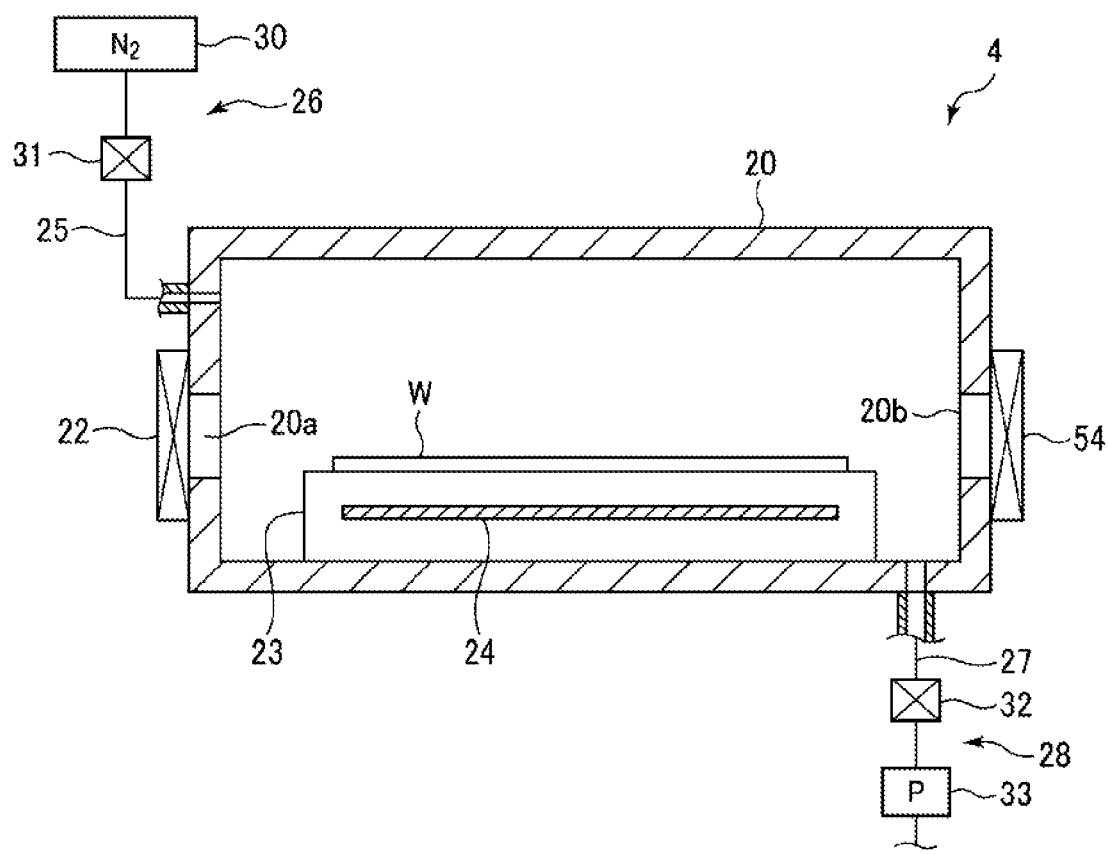
FIG. 2 is a sectional view showing a PHT (Post Heat Treatment) processing apparatus mounted in the processing system of FIG. 1.

As shown in FIG. 2, each of the PHT processing apparatuses 4 includes a chamber 20 configured to be vacuum exhausted, and a mounting table 23 on which a wafer W is mounted inside the chamber 20. A heater 24 is embedded in the mounting table 23. The wafer W, on which a COR process has been performed, is heated so as to perform a PHT process for evaporating (subliming) a reaction product generated by the COR process. The chamber 20 is provided with a transfer port 20a on a side of the load lock chamber 3 to transfer a wafer W between the chamber 20 and the load lock chamber 3. The transfer port 20a is configured to be opened and closed by a gate valve 22. In addition, the chamber 20 has a transfer port 20b provided on a side of the COR processing apparatus 5 to transfer a wafer W between the chamber 20 and the COR processing apparatus 5. The transfer port 20b is configured to be opened and closed by a gate valve 54. Further, a gas supply mechanism 26 is provided including a gas supply line 25 configured to supply the chamber 20 with an inert gas, such as nitrogen gas ($N_2$), and an exhaust mechanism 28 including an exhaust line 27 configured to exhaust the gas from the interior of the chamber 20. The gas supply line 25 is connected to a nitrogen gas supply source 30. The gas supply line 25 is also provided with a flow rate adjustment valve 31 capable of opening and closing the gas supply line 25 and adjusting the supply flow rate of the nitrogen gas. The exhaust line 27 of the exhaust mechanism 28 is provided with an opening/closing valve 32 and a vacuum pump 33.

Figure 3:
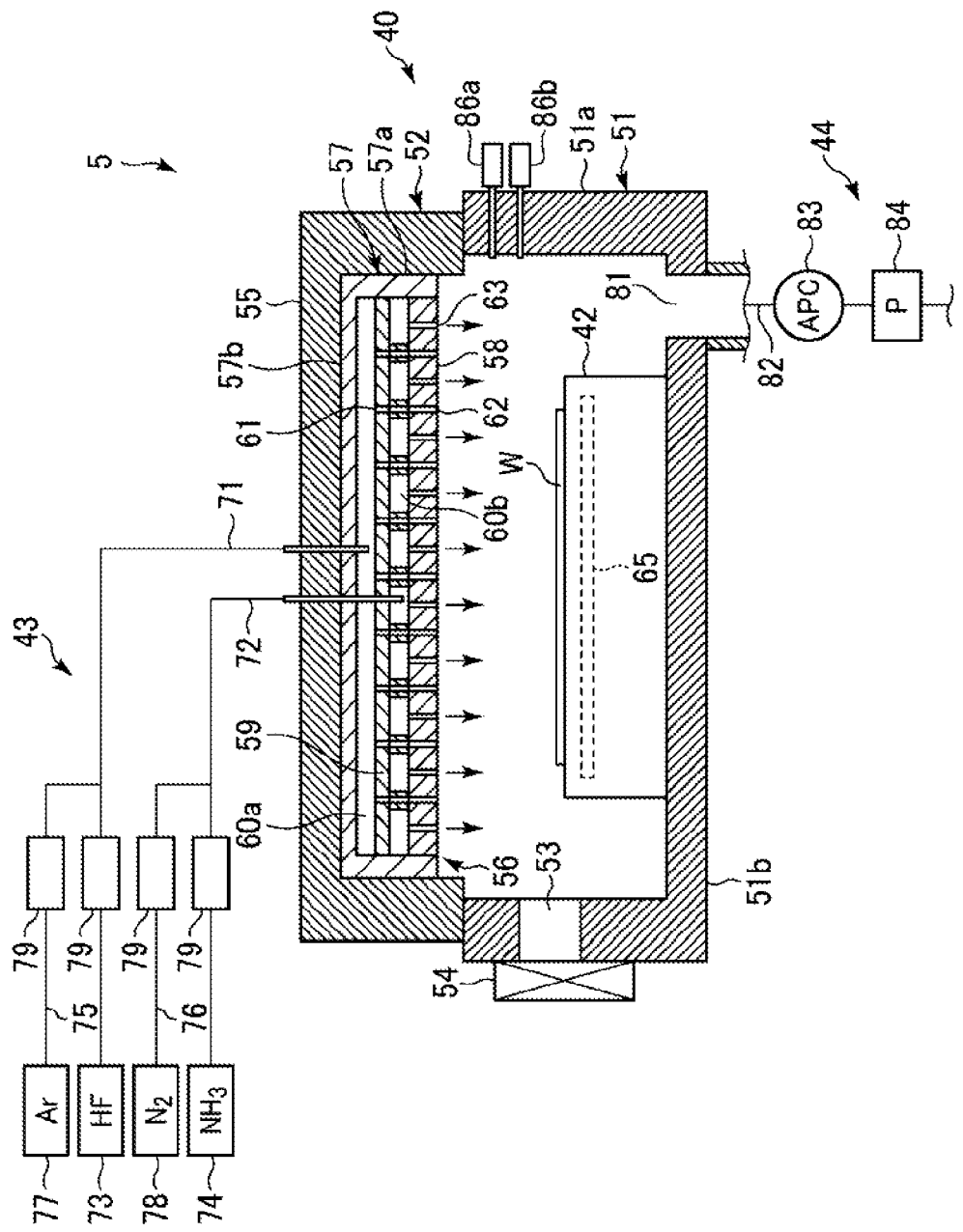
FIG. 3 is a sectional view showing a schematic configuration of a COR processing apparatus in the processing system of FIG. 1.

As shown in FIG. 3, each of the COR processing apparatuses 5 includes an airtight chamber 40. Inside the chamber 40, a mounting table 42 is provided to mount a wafer W thereon in a generally horizontal position. In addition, the COR processing apparatus 5 is provided with a gas supply mechanism 43 configured to supply an HF gas, an $NH_3$ gas, and the like into the chamber 40, and an exhaust mechanism 44 configured to exhaust the interior of the chamber 40.

The chamber 40 is configured with a chamber main body 51 and a lid 52. The chamber main body 51 includes a generally cylindrical sidewall portion 51a and a bottom portion 51b. The chamber main body 51 has an opened upper portion, wherein the opening is covered by the lid 52. A gap between the sidewall portion 51a and the lid 52 is sealed by a seal member (not shown), thereby securing airtightness inside the chamber 40.

The sidewall portion 51a is provided with a transfer port 53 to load and unload a wafer W to and from the chamber 20 of the PHT processing apparatus 4. The transfer port 53 is configured to be opened and closed by a gate valve 54.

The lid 52 includes a lid member 55 defining an outside of the lid 52, and a shower head 56 fitted inside the lid member 55 to face the mounting table 42. The shower head 56 includes a main body 57 having a cylindrical sidewall 57a and an upper wall 57b, and a shower plate 58 installed at a bottom portion of the main body 57. A space defined by the main body 57 and the shower plate 58 is provided with a plate 59 in parallel with the shower plate 58. A first space 60a is defined between the upper wall 57b of the main body 57 and the plate 59. A second space 60b is defined between the plate 59 and the shower plate 58.

A first gas supply pipe 71 of the gas supply mechanism 43 is inserted to the first space 60a. A plurality of gas passages 61 leading to the first space 60a extend from the plate 59 to the shower plate 58. These gas passages 61 lead to a plurality of first gas discharge holes 62 formed at the shower plate 58. In the meantime, a second gas supply pipe 72 of the gas supply mechanism 43 is inserted into the second space 60b. A plurality of second gas discharge holes 63 formed at the shower plate 58 are connected to the second space 60b.

In addition, the gas supplied from the first gas supply pipe 71 to the first space 60a is discharged into the chamber 40 through the gas passages 61 and the first gas discharge holes 62. Further, the gas supplied from the second gas supply pipe 72 to the second space 60b is discharged through the second gas discharge holes 63.

The mounting table 42 has a generally circular shape in a plan view and is fixed to the bottom portion 51b of the chamber 40. A temperature adjuster 65 configured to adjust a temperature of the mounting table 42 is installed inside the mounting table 42. The temperature adjuster 65 has a tube line, for example, in which a temperature control medium (e.g., water or the like) circulates. Thus, heat exchange with the temperature control medium flowing in the tube line is performed to adjust a temperature of the mounting table 42. Accordingly, a temperature control of a wafer W on the mounting table 42 is achieved.

The gas supply mechanism 43 includes the first gas supply pipe 71 and the second gas supply pipe 72 described above. In addition, the gas supply mechanism 43 includes an HF gas supply source 73 and an $NH_3$ gas supply source 74 connected to the first gas supply pipe 71 and the second gas supply pipe 72, respectively. The first gas supply pipe 71 is connected to a third gas supply pipe 75, and the second gas supply pipe 72 is connected to a fourth gas supply pipe 76. The third gas supply pipe 75 and the fourth gas supply pipe 76 are connected to an Ar gas supply source 77 and an N₂ gas supply source 78, respectively. The first to fourth gas supply pipes 71, 72, 75 and 76 are provided with flow rate controllers 79 configured to open and close the passages and control their flow rates. Each flow rate controller 79 includes, for example, an opening/closing valve and a mass flow controller.

In addition, the HF gas and the Ar gas pass through the first gas supply pipe 71, the first space 60a and the gas passages 61 and are discharged into the chamber 40 through the first gas discharge holes 62. The NH₃ gas and the N₂ gas pass through the second gas supply pipe 72 and the second space 60b and are discharged into the chamber 40 through the second gas discharge holes 63.

Among the gases, the HF gas and the NH₃ gas are reaction gases. The HF gas and the NH₃ gas are not mixed until they are discharged from the shower head 56 but then mixed within the chamber 40. The Ar gas and the N₂ gas are dilution gases. In addition, the chamber 40 is maintained at a predetermined pressure by introducing the HF gas and the NH₃ gas as reaction gases and the Ar gas and the N₂ gas as dilution gases into the chamber 40 at predetermined flow rates. At this time, the HF gas and the NH₃ gas react with a silicon oxide film formed on the wafer W, thereby generating ammonium fluorosilicate (AFS) as a reaction product.

As a dilution gas, the Ar gas or the N₂ gas may be used solely. Also, another inert gas may be used, or two or more kinds of Ar gas, N₂ gas and other inert gases may be used.

The exhaust mechanism 44 has an exhaust pipe 82 connected to an exhaust port 81 formed at the bottom portion 5 1b of the chamber 40. In addition, the exhaust mechanism 44 has an automatic pressure control valve (APC) 83 configured to control an internal pressure of the chamber 40 and a vacuum pump 84 configured to exhaust the interior of the chamber 40, which are installed at the exhaust pipe 82.

For pressure gauges configured to measure the internal pressure of the chamber 40, two capacitance manometers 86a and 86b are installed in the chamber 40 from the sidewall of the chamber 40. The capacitance manometer 86a is for high pressure measurement, and the capacitance manometer 86b is for low pressure measurement.

The various kinds of components, such as the chamber 40, the mounting table 42 and the like, which constitute the COR processing apparatus 5, are made of Al. The Al material of the chamber 40 may be pure Al or one obtained by anodizing the inner surface thereof (the inner surface of the chamber main body 51, the bottom surface of the shower head 56, or the like). In the meantime, since the Al surface of the mounting table 42 is required to have high wear resistance, in some embodiments, the surface is anodized to form an oxide coating film ($Al_2O_3$) having high wear resistance at the surface.

As shown in FIG. 1, the processing system 1 includes a control unit 90. The control unit 90 includes a controller having a microprocessor (computer) which controls the respective components of the processing system 1. The controller is connected to a keyboard through which an operator performs a command input operation to manage the processing system 1, a display which visually displays an operation status of the processing system 1, and the like. The controller is connected to a memory part which stores a control program configured to implement various processes executed by the processing system 1, such as the supply of the processing gas, the exhaust of the interior of the chamber 40 and the like in the COR processing apparatus 5 under the control of the controller; a control program configured to execute predetermined processes on respective components of the processing system 1 according to process conditions, i.e. a processing recipe; and/or various kinds of databases. The recipe is stored in a suitable memory medium of the memory part. Further, if needed, an arbitrary recipe may be called out from the memory part and may be executed by the controller. Thus, the desired processes of the processing system 1 are performed under the control of the controller.

Next, a gas processing method using such a processing system 1 will be described.

First, wafers W each having a silicon oxide film formed on a surface thereof are accommodated in a carrier C and then transferred to the processing system 1. In the processing system 1, in a state where the gate valve 16 at the atmospheric side is opened, one of the wafers W is transferred from the carrier C of the loading/unloading unit 2 to the load lock chamber 3 by any one of the transfer arms 11a and 11b of the first wafer transfer mechanism 11. The wafer W is then delivered to the pick of the second wafer transfer mechanism 17 in the load lock chamber 3.

Then, the gate valve 16 at the atmospheric side is closed to vacuum exhaust the interior of the load lock chamber 3, and the gate valves 22 and 54 are opened. Then, the pick is extended to the COR processing apparatus 5 to mount the wafer W on the mounting table 42.

Thereafter, the pick is returned to the load lock chamber 3, and the gate valve 54 is closed to seal the interior of the chamber 40. In such a state, a temperature of the wafer W on the mounting table 42 is adjusted to a predetermined target value (for example, 20 to 40 degrees C.) by the temperature adjuster 65. The HF gas and the Ar gas are supplied to the shower head 56 from the gas supply mechanism 43 through the first gas supply pipe 71 and discharged into the chamber 40 from the first gas discharge holes 62 through the first space 60a and the gas passages 61. The NH₃ gas and the N₂ gas are supplied to the shower head 56 through the second gas supply pipe 72 and discharged into the chamber 40 from the second gas discharge holes 63 through the second space 60b. In addition, any one of the Ar gas and the N₂ gas as dilution gases may be used.

Accordingly, the HF gas and the NH₃ gas are not mixed in the shower head 56 and are discharged into the chamber 40. The COR process is performed on the wafer W by these gases.

That is, the silicon oxide film on the surface of the wafer W chemically reacts with molecules of the hydrogen fluoride gas and molecules of the ammonia gas, such that ammonium fluorosilicate (AFS), water, and the like are generated as reaction products to be maintained on the surface of the wafer W.

After such a process is completed, the gate valves 22 and 54 are opened. The processed wafer W on the mounting table 42 is taken by the pick of the second wafer transfer mechanism 17 and is mounted on the mounting table 23 in the chamber 20 of the PHT processing apparatus 4. Then, the pick is returned back into the load lock chamber 3, and the gate valves 22 and 54 are closed. While the N₂ gas is introduced into the chamber 20, the wafer W on the mounting table 23 is then heated by the heater 24. Accordingly, the reaction products generated by the COR process are heated, evaporated and removed.

In this way, since the PHT process is performed after the COR process, the silicon oxide film can be removed from the surface of the wafer W in a dry atmosphere. Thus, no water mark or the like is generated. Further, etching can be performed under non-plasma conditions, and so the process causes little damage. In addition, since the COR process stops the etching after a predetermined time elapses, an end point management thereof is unnecessary because no reaction progresses even if over-etching is preset.

However, in the COR process, if the HF gas and the NH₃ gas are introduced into the chamber 40 simply through the shower head 56, a distribution of these gases may not be uniform. Thus, etching uniformity may be deteriorated in some cases. In addition, there are also instances where an etching distribution needs to be actively controlled. However, there was no means for adjusting a gas distribution in such a case.

Therefore, in this present embodiment, the shower plate 58 of the shower head 56 is divided into a plurality of regions corresponding to the wafer W. In addition, a distribution of the HF gas and the NH₃ gas is controlled by blocking the gas discharge holes 62 and 63 of any one or more of the plurality of regions.

Figure 4:
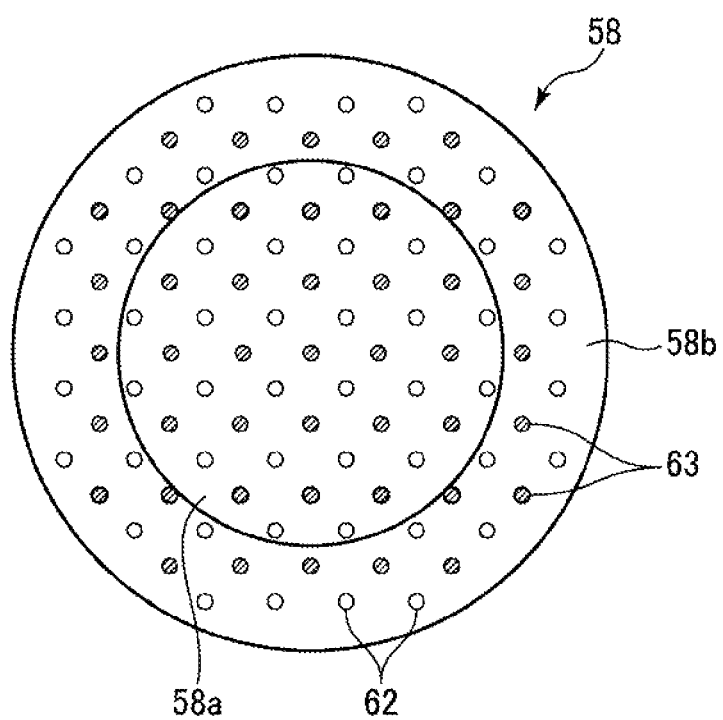
FIG. 4 is a schematic view showing that a shower plate is concentrically divided into an inside region and an outside region.

For example, as shown in FIG. 4, the shower plate 58 is concentrically divided into an inside region 58a and an outside region 58b, and the distribution of the HF gas and the NH₃ gas is controlled by blocking the gas discharge holes 62 and 63 of any one of the regions.

Since the COR process is performed under non-plasma conditions, when the HF gas and the NH₃ gas are diffused in the chamber 40, the movement of gas molecules is smaller than that under plasma conditions. Thus, a gas distribution in which a position of the gas discharge holes of the shower plate 58 is reflected can be formed. That is, the gas discharge holes can be partially blocked to decrease a gas concentration in a wafer region corresponding to the blocked region, thereby enabling a gas distribution at the wafer surface to be adjusted. Accordingly, an in-plane etching amount distribution of the wafer can be finely adjusted.

Figure 5A:
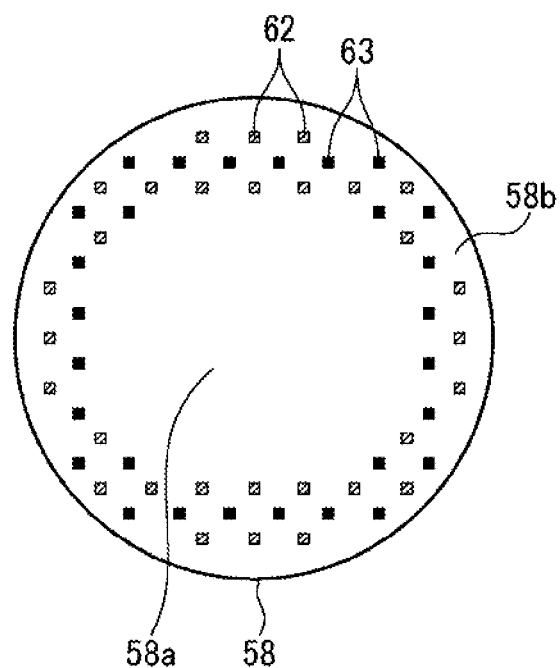
FIG. 5A is a view showing that gas discharge holes in the inside region are blocked.
Figure 5B:
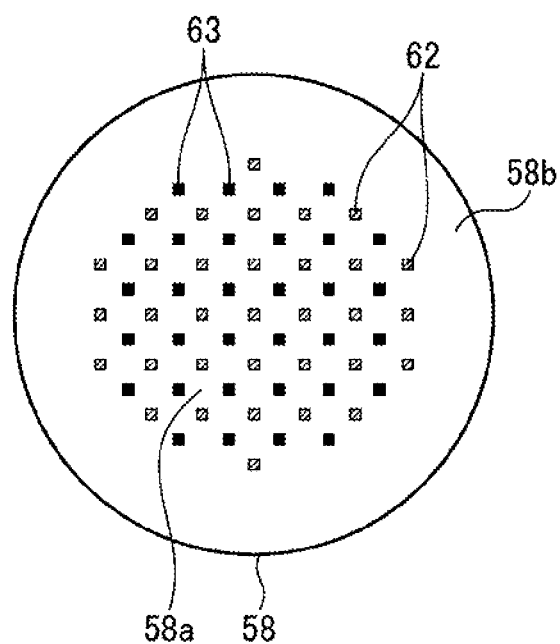
FIG. 5B is a view showing that gas discharge holes in the outside region are blocked.
Figure 6A:
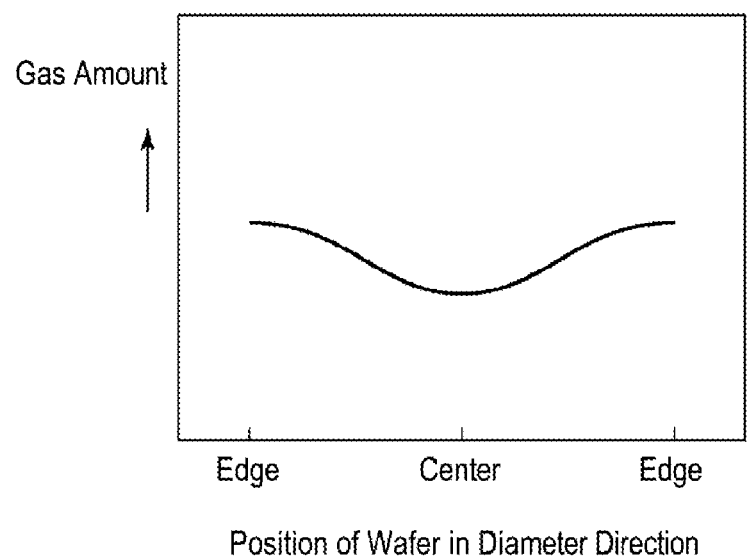
FIG. 6A is a view schematically showing a gas distribution when the gas discharge holes in the inside region are blocked.
Figure 6B:
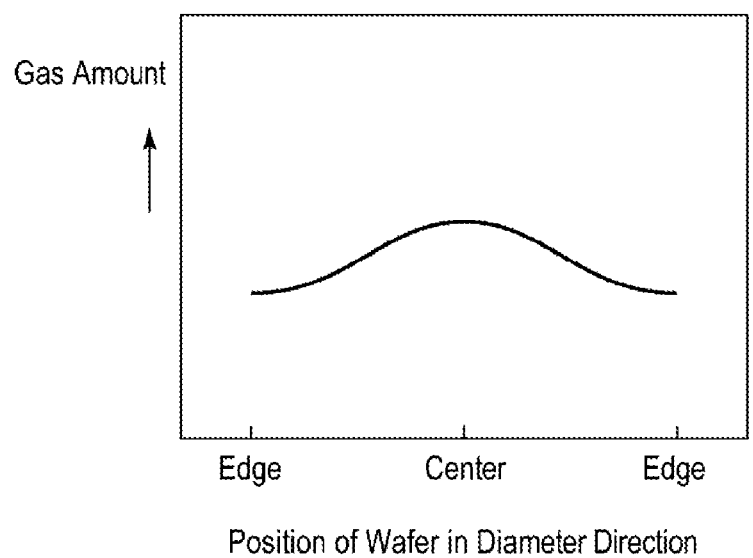
FIG. 6B is a view schematically showing a gas distribution when the gas discharge holes in the outside region are blocked.

For example, when the gas discharge holes 62 and 63 of the inside region 58a of FIG. 4 are blocked, the gases are discharged only from the gas discharge holes 62 and 63 of the outside region 58b as shown in FIG. 5A. Thus, a gas distribution of the surface of the wafer W immediately below the shower plate 58 is typically as shown in FIG. 6A. Contrarily, when the gas discharge holes 62 and 63 of the outside region 58b are blocked, the gases are discharged only from the gas discharge holes 62 and 63 of the inside region 58a as shown in FIG. 5B. Thus, a gas distribution of the surface of the wafer W immediately below the shower plate 58 is typically as shown in FIG. 6B. Therefore, as the gas discharge holes corresponding to a partial region of the shower plate 58 as described above are blocked, it is possible to adjust an in-plane gas distribution of the wafer. In addition, an in-plane etching amount distribution of the silicon oxide film on the wafer can be finely adjusted.

In this way, since the in-plane etching amount distribution of the wafer can be adjusted, in-plane etching uniformity can be improved. In addition, an etching amount distribution can also be controlled to a desired level.

A means for blocking the gas discharge holes need not be limited to any one means. For example, plugs may be inserted into the respective gas discharge holes 62 and 63, the inside region 58a or the outside region 58b may be covered together, or the like. In addition, the gas discharge holes 62 and 63 may be opened or closed by an actuator.

In order to control a gas distribution, in some embodiments, the chamber may have a high internal pressure, for example, 50 mTorr (6.7 Pa) or more. Further, in terms of the reaction, the internal pressure may be 2000 mTorr (266 Pa) or less.

Further, if a distance from the bottom surface of the shower plate 58 to the surface of the wafer W is too large, it is difficult to effectively adjust a distribution of the HF gas and the NH₃ gas due to diffusion of the gases. Thus, in some embodiments, the distance from the bottom surface of the shower plate 58 to the surface of the wafer W is 150 mm or less. In addition, since some degree of gas diffusion is needed in order to conduct the reaction of the HF gas and NH₃ gas with the silicon oxide film on the wafer surface uniformly, in some embodiments, the distance may be 50 mm or more.

Ranges of other conditions of the COR process may be as follows:

Processing Temperature: 10 to 80 degrees C., more specifically, 40 degrees or less Flow Rate of HF Gas: 20 to 1000 sccm (mL/min)

Flow Rate of NH₃ Gas: 20 to 1000 sccm (mL/min)

Total Flow Rate of Ar gas and N₂ gas: 2000 sccm (mL/min) or less

Ranges of conditions of the PHT process are as follows:

Processing Temperature: 90 to 400 degrees C.

Pressure: 50 to 2000 mTorr (6.7 to 266 Pa)

Flow Rate of N₂ Gas: 500 to 8000 sccm (mL/min)

As described above, according to this embodiment, the shower plate is divided into a plurality of regions corresponding to the object to be processed, and the gas discharge holes of any one or more of the plurality of regions is blocked to control a distribution of at least one of the HF gas and the NH₃ gas. Thus, it is possible to finely control an in-plane etching amount distribution of the silicon oxide film on the object to be processed. For this reason, in-plane etching uniformity can be improved. In addition, an etching amount distribution can also be controlled to a desired level.

EXPERIMENTAL EXAMPLES

Next, experimental examples actually performed will be described.

Using the COR apparatus having the configuration shown in FIG. 3, COR processes were performed for the cases where the gas discharge holes of the inside region of the shower plate were blocked as shown in FIG. 5A (Inside Blockage), where the gas discharge holes of the outside region of the shower plate were blocked as shown in FIG. 5B (Outside Blockage), and where the gas discharge holes were not blocked (Standard). Then, AFS as a reaction product was removed by heat processing at the PHT processing apparatus. In addition, the distance between the bottom surface of the shower plate and the wafer surface, the COR process conditions, and the PHT process conditions were set to the above-described ranges.

Figure 7:
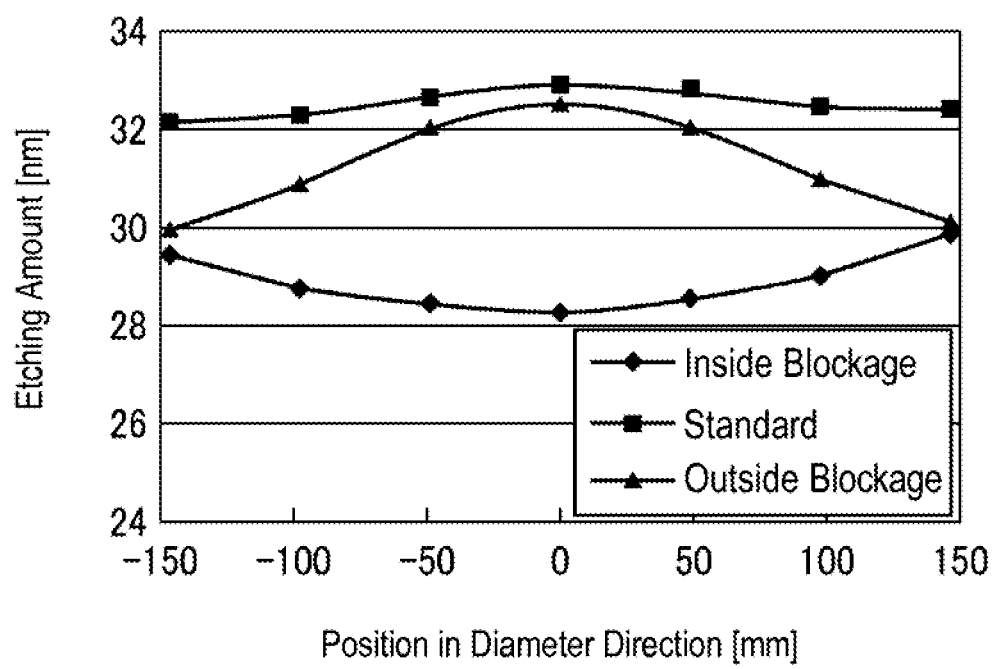
FIG. 7 is a view showing etching amount distributions along the diameter direction of a wafer for the cases of "Inside Blockage," "Outside Blockage," and "Standard" in Experimental Examples.

FIG. 7 is a view showing etching amount distributions in the diameter direction of a wafer in "Inside Blockage," "Outside Blockage," and "Standard" of Experimental Examples. As shown in FIG. 7, it was confirmed that the etching amount in the inside region could be adjusted to be small in "Inside Blockage" as compared to "Standard" and the etching amount in the outside region could be adjusted to be small in "Onside Blockage" as compared to "Standard."

The present disclosure is not limited to the above-described embodiments and can be variously modified. For example, above describes that the shower plate is concentrically divided into the inside region and the outside region corresponding to a wafer, and a distribution of the HF gas and the NH₃ gas is controlled by blocking the gas discharge holes of any one of the regions. However, the number of regions may be three or more, and the divided shape of the regions is not limited to the concentric shape. That is, any type of configuration may be possible so long as the shower plate is divided into a plurality of regions corresponding to a wafer and the gas discharge holes of any one or more of the plurality of regions are blocked.

Further, the above embodiment describes a post mix type, in which the HF gas and the NH₃ gas are discharged from separate sets of gas discharge holes used as the shower head. Thus, both the sets of gas discharge holes in a predetermined region are blocked. However, only discharge holes corresponding to any one of the gases may be blocked. In addition, common gas discharge holes may be provided, and the HF gas and the NH$_3$ gas may be supplied at different timings.

In addition, although it has been described that the semiconductor wafer is used as the object to be processed, the object to be processed is not limited to the semiconductor wafer if it has an oxide film formed thereon.

EXPLANATION OF REFERENCE NUMERALS

1: processing system, 2: loading/unloading unit, 3: load lock chamber, 4: PHT processing apparatus, 5: COR processing apparatus, 11: first wafer transfer mechanism, 17: second wafer transfer mechanism, 40: chamber, 43: gas supply mechanism, 44: exhaust mechanism, 56: shower head, 58: shower plate, 58*a*: inside region, 58*b*: outside region, 62: first gas discharge hole, 63: second gas discharge hole, 73: HF gas supply source, 74: NH$_3$ gas supply source, 77: Ar gas supply source, 78: N$_2$ gas supply source, 86*a*, 86*b*: capacitance manometer, 90: control unit, W: semiconductor wafer

What is claimed is:

1. A gas processing method, in which an object to be processed having a silicon oxide film formed on a surface thereof is mounted on a mounting table in a chamber, an HF gas and an NH$_3$ gas as reaction gases are discharged onto the object to be processed mounted on the mounting table through a plurality of gas discharge holes of a shower plate installed above the mounting table corresponding to the object to be processed mounted on the mounting table, a process of causing a reaction of the HF gas and the NH$_3$ gas with the silicon oxide film on the object to be processed is performed, and thereafter a reaction product generated by the reaction is heated and removed by decomposition, thereby performing an etching process, wherein the shower plate is divided into a plurality of regions according to the object to be processed, and the gas discharge holes of any one or more of the plurality of regions are blocked to control the discharge of the HF gas and/or the NH$_3$ gas through the gas discharge holes, and wherein the shower head is configured such that the HF gas is discharged through a plurality of first gas discharge holes of the shower plate and the NH$_3$ gas is discharged through a plurality of second gas discharge holes of the shower plate.

2. The gas processing method of claim 1, wherein the shower plate is concentrically divided into an inside region and an outside region, and the gas discharge holes of any one of these regions are blocked to control the discharge of the HF gas and/or the NH$_3$ gas through the has discharge holes.

3. The gas processing method of claim 1, wherein any one or both of the first gas discharge holes and the second gas discharge holes of the shower plate are blocked.

4. The gas processing method of claim 1, wherein the reaction is conducted at an internal pressure of the chamber of 50 to 2000 mTorr.

5. The gas processing method of claim 1, wherein a distance from a bottom surface of the shower plate to the surface of the object to be processed on the mounting table is in a range of 50 to 150 mm.

* * * * *